United States Patent
Spitz et al.

[11] Patent Number: 6,060,776
[45] Date of Patent: May 9, 2000

[54] RECTIFIER DIODE

[75] Inventors: Richard Spitz; Siegfried Schuler, both of Reutlingen, Germany

[73] Assignee: Robert Bosch GmbH, Stuttgart, Germany

[21] Appl. No.: 09/091,973

[22] PCT Filed: Nov. 9, 1996

[86] PCT No.: PCT/DE96/02139

§ 371 Date: Jun. 26, 1998

§ 102(e) Date: Jun. 26, 1998

[87] PCT Pub. No.: WO97/24762

PCT Pub. Date: Jul. 10, 1997

[30] Foreign Application Priority Data

Dec. 30, 1995 [DE] Germany ............................ 195 49 202

[51] Int. Cl.[7] .............................. H01L 23/02; H01L 23/04
[52] U.S. Cl. .......................... 257/706; 257/678; 257/699
[58] Field of Search .................................. 257/706, 678, 257/698, 699, 688

[56] References Cited

U.S. PATENT DOCUMENTS

| | | | |
|---|---|---|---|
| 3,823,339 | 7/1974 | Borneman et al. | 315/69 |
| 4,532,539 | 7/1985 | Frister | 257/686 |
| 5,760,425 | 6/1998 | Kobayashi et al. | 257/688 |

FOREIGN PATENT DOCUMENTS

| | | | |
|---|---|---|---|
| 0 345 067 | 2/1989 | European Pat. Off. | 257/686 |
| 41 12 286 A1 | 10/1991 | Germany . | |

*Primary Examiner*—Mahshid Saadat
*Assistant Examiner*—Jhihan B Clark
*Attorney, Agent, or Firm*—Michael J. Striker

[57] ABSTRACT

A rectifier diode has a base which is press-fittable into an intended opening of a rectifier arrangement, a pedestal disposed on the base integrally with the base, a semiconductor chip secured to the pedestal, a head wire secured to the chip, the base being formed to connect the diode thermally and electrically to the rectifier arrangement, and a unit for mechanically stabilizing the base and including a bulwark provided on a bottom of the base in a region of the pedestal and surrounding the pedestal, the bulwark being separated from the pedestal by a trench and being integral with the bottom of the base, a pressing region for absorbing forces oriented at right angles to a plane of the semiconductor chip and disposed on a side of the bulwark remote from the trench and between bulwark and a substantially cylindrical wall of the base disposed substantially perpendicular to the bottom of the base, the trench being located between the bulwark and the pedestal and having a radial extent that is approximately twice as great as a height of the bulwark measured from the trench upward.

11 Claims, 3 Drawing Sheets

RECTIFIER DIODE

BACKGROUND OF THE INVENTION

The invention relates to a rectifier diode. It is known for medium- and higher-power rectifier diodes to be embodied as press-fit diodes. The press-fit diodes have a press-fit base, which is press-fitted into a corresponding recess in a rectifier arrangement. In this process the press-fit base at the same time accomplishes durable thermal and electrical connection of the rectifier diode to the rectifier arrangement. Such arrangements are known in automotive engineering, for instance, where they are used as rectifiers in the motor vehicle generators. The press-fit base there has a fastening region to which a semiconductor chip is secured, for instance by soldering. A so-called head wire is secured in turn on the semiconductor chip, again for instance by soldering, and it is then firmly connected electrically to a phase supply line of the motor vehicle generator, for instance by soldering or welding.

When the rectifier diode is press-fitted into an intended opening of a rectifier arrangement, mechanical forces engage the edge of the rectifier diode. These mechanical forces are transmitted via the press-fit base to the fastening region of the semiconductor chip. In the press-fitting operation, the semiconductor chip mounted on the fastening region undergoes bending stress. The solder layers between the semiconductor chip and the press-fit base and between the semiconductor chip and the head wire are also affected by the bending stress.

In German Patent Disclosure DE 41 12 286 A1, the press-fit base is made of solid metal, specifically in the form of a centrally disposed pedestal on which the semiconductor chip is mounted. This already provides spatial separation of the semiconductor chip from the edge of the press-fit base that is acted upon by the press-fitting forces. Despite the separation, the chip and the solder layers surrounding it undergo bending stress, which can lead to the immediate failure or later premature aging of the press-fit diode.

In an alternative construction of a rectifier diode without a pedestal or a bulwark surrounding such a pedestal, the sturdiness and reliability of the component depends on the chip's being secured in an exactly centered manner in production.

SUMMARY OF THE INVENTION

Accordingly, it is an object of present invention to provide a rectifier diode which avoids the disadvantages of the prior art.

In keeping with these objects, one feature of the present invention resides, briefly stated, in a rectifier diode in which, in order to mechanically stabilize the base, the bottom of the base in the region of the pedestal has a bulwark surrounding the pedestal, the bulwark separated from the pedestal by a trench is integral with the bottom of the base, a pressing region for absorbing forces oriented at right angle tot he plane of the semiconductor chip is disposed on the side of the bulwark remote from the trench between the bulwark and a substantially cylindrical wall of the base disposed substantially perpendicular to the base bottom, and the trench embodied between the bulwark and the pedestal has a radial extent that is approximately twice as great as the height of the bulwark measured from the trench upwards.

When the rectifier diode is designed in accordance with the present invention it has the advantage over the prior art that sturdiness, with regard to deformation, for instance in the press-fitting operation, is achieved in a simple way. Because the base bottom, in the region of the pedestal, has a bulwark that surrounds this pedestal and is integral with the base bottom, the stiffness of the entire base can be improved by simple geometrical variations in the height of the bulwark and in its spacing from the pedestal.

Advantageous refinements of and improvements to the rectifier diode defined by the main claim are possible with the provisions recited in the dependent claims.

The disposition of a press-fit region on the side of the bulwark remote from the trench is especially advantageous. This assures sturdiness of the rectifier diode to withstand deformation on being press-fitted into a rectifier arrangement. The combination of the press-fitting region, the bulwark, and the trench lessens the bending stress on the chip bearing face in comparison to a construction without the bulwark.

In a preferred feature of the invention it is provided that the press-fitting region of the press-fit diode is separated from the base by a bulwark whose height is approximately half the length of the trench between the base and the bulwark. With minimal bending stress during the pressfitting operation, thus in the context of given production techniques for the base at the same time the defect rate in production is less, because chip centering on the chip bearing face of the pedestal is not as critical.

The combination of the head cylindrical and the head cone is advantageous, because this combines the advantages of the head cylinder (high thermal capacity and large mass for any required pulse strength of the diode) and of the head cone (resistance to tensile stress on the head wire, low structural height of the rectifier diode).

The optimized choice of the angle of approximately 20° is advantageous in the sense of a form lock with the package. Despite an oblique contact face with the package, the normal component of the tensile force (FIG. 4) that is decisive for the form lock is only a few percent less than the axial tensile force itself.

The compact design resulting from a specialized embodiment of the package is advantageous. Only at the edge of the head, in other words where strong forces occur via the form lock of the head with the package, for instance if the tensile force at the head wire also has non-axial components, is the package designed as especially thick.

Providing a chamfer or a shoulder or the like at the head cylinder, at the base, and/or at the chip itself is advantageous, because a thicker solder layer can be established at the edge of the chip than in comparison with a construction without a chamfer, shoulder or the like. This reduces solder fatigue at the edge of the chip.

The advantage of a shoulder is that an intimate form lock of the base with the package exists. Moreover, in producing the package, the point of departure is for instance a casing resin composition that shrinks onto the base on drying and thereby presses the head region of the rectifier diode, together with the semiconductor chip, firmly against the press-fit base.

An oblique edge at the shoulder prevents severe mechanical strains in the package, for instance if the rectifier diode is subject to tensile stress. High mechanical stresses or thermal strains always develop at sharp edges. By using an oblique edge at the end of the shoulder, a sharp edge of this kind is avoided.

BRIEF DESCRIPTION OF THE DRAWINGS

One exemplary embodiment of the invention own in the drawing and described in further detail below.

DESCRIPTION OF THE EXEMPLARY EMBODIMENT

Figure 1:
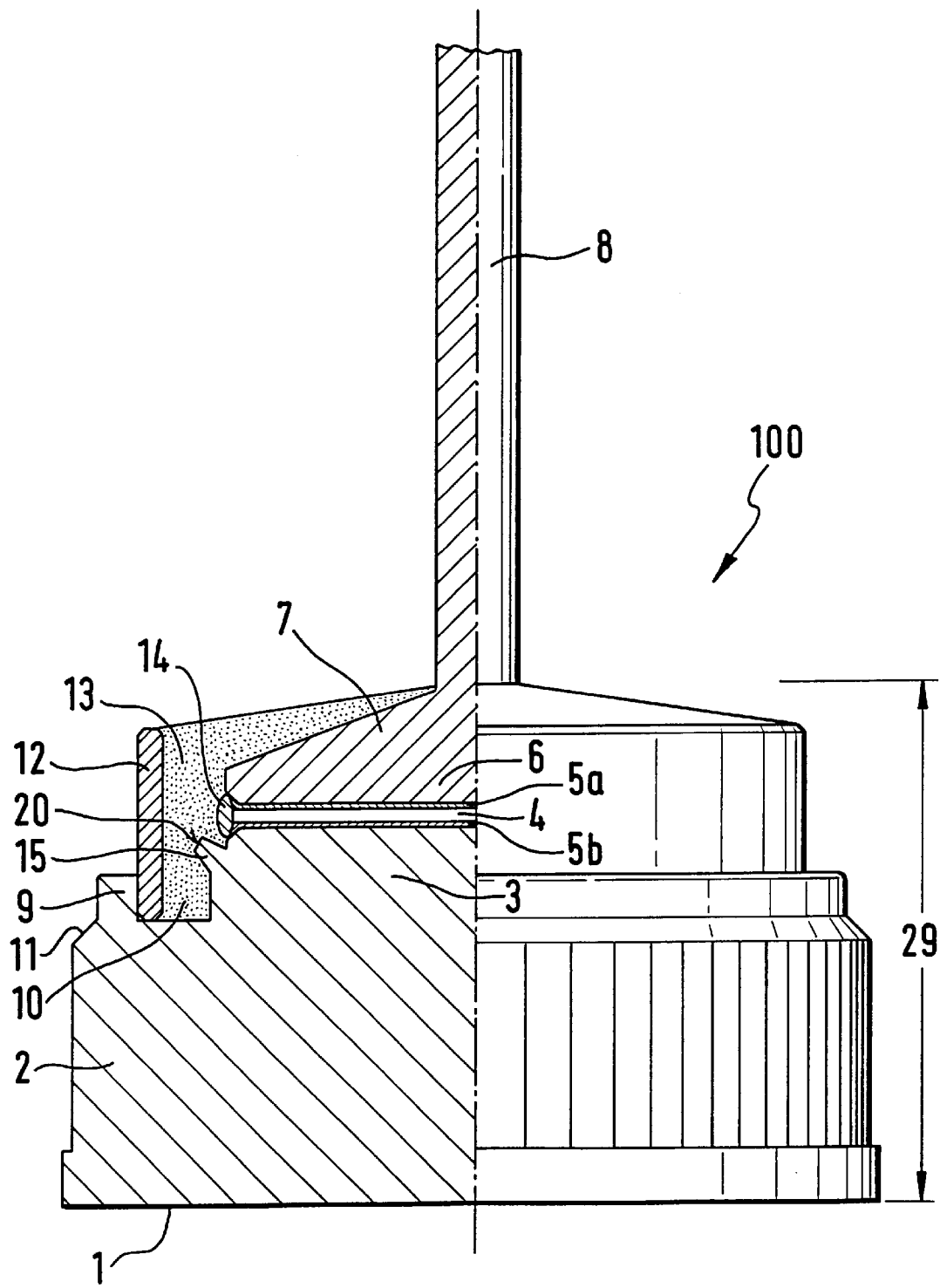
FIG. 1 schematically shows a partly cutaway cross section of a rectifier diode.

FIG. 1 shows a rectifier diode, generally identified by reference numeral 100, in a partly cutaway cross section. The rectifier diode 100 has a base 2 with a base bottom 1. Integrally joined to the base 2 is a pedestal 3, on which in turn a semiconductor chip is applied, for instance by soldering (solder 5b). The semiconductor chip 4 is in turn joined, for instance again by soldering (solder 5a), to a head wire 8 via a head cylinder 6 and a head cone 7. The preferably centered pedestal 3 is surrounded by an encompassing bulwark 9 and a trench 10 formed by the bulwark 9 and the pedestal 3. Viewed from the direction of the pedestal 3, there is also a press-fit region 11 on the far side of the bulwark 9, and when the rectifier diode 100 is press-fitted, forces can act on this region at right angles to the plane of the semiconductor chip 4. The head cone 7, the head cylinder 6, the semiconductor chip 4 and the pedestal 3 are surrounded by a package 13 that is bounded by a protective sheath 12. The pedestal 3 and the head cylinder 6 have a chamfer 16 and/or (FIG. 5) at the edge toward the semiconductor chip. These chamfers may be filled, for instance with solder 18 and/or 19. A passivation 14 is also applied to the edge of the chip and seals both the chip and the solder at the edge of the chip. The pedestal 3 also has an encompassing shoulder 15 with an oblique edge 20 that protrudes into the package 13.

Figure 4:
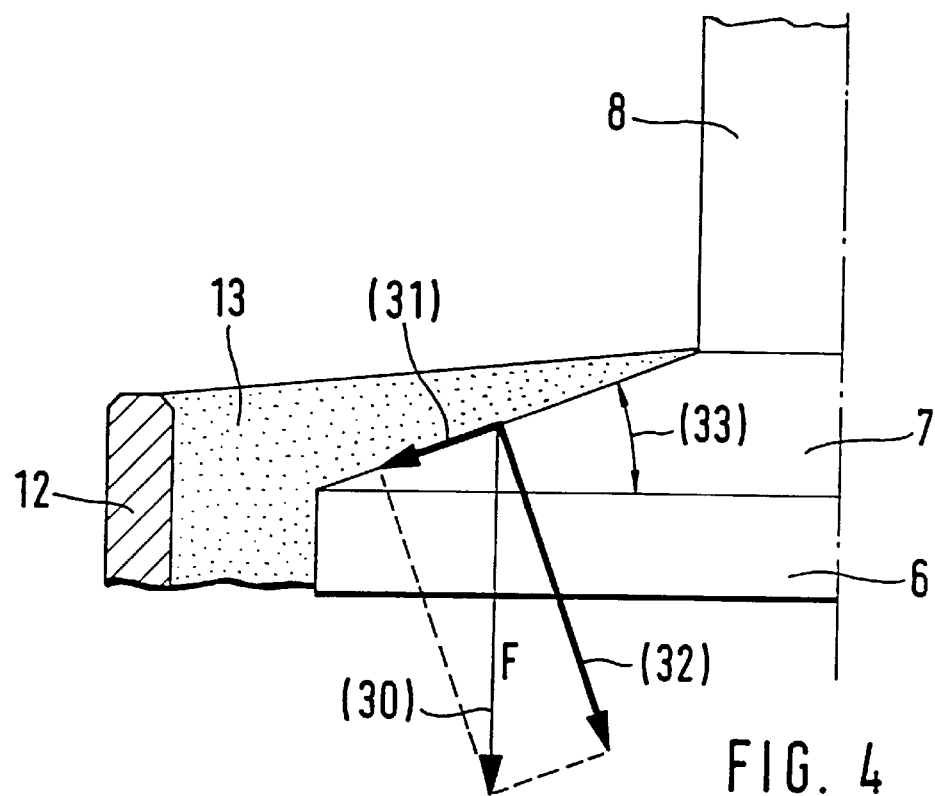
FIG. 4 shows a further detail of FIG. 1 in a schematic enlargement.

An especially advantageous feature of the rectifier diode 100 shown in FIG. 1 is that the semiconductor chip 4 is secured to an elevated pedestal 3 that is surrounded by a bulwark 9. The trench 10 thus formed typically has a length that is about twice as great as the height of the bulwark 7. The advantage of the is that the construction is especially resistant to deformation on press-fitting of the rectifier diode. The combination of the pedesetal and the bulwark/trench assures a more-homeneous and lower bending stress at the chip bearing face, in comparison with a construction that lacks a significantly embodied bulwark 9. This sturdiness is confirmed by finite element calculations. Another advantage is that the chip centering is less critical in comparison with the construction in FIG. 4 of German Patent Disclosure DE 41 12 286. In the construction described in this reference, the sturdiness and reliability of the component depend essentially on securing the chip in an exactly centered way during production. In the construction of the present invention, the bulwark is advantageously lower than the pedestal, for among other reasons so as not impair access to the chip during diode production and during passivation.

In FIG. 1, the rectifier diode 100 has a shoulder 15 on its base 2, for instance at the circumference of the pedestal 3. This optional shoulder serves to establish an intimate form lock of the package with the base. On the one hand this produces mechanical stability; in a sense, the base is caught production, as it dries out, a package embodied of casting resin composition, for instance, presses the head part of the diode together with the semiconductor chip onto the base ("shrinks on"). The overall result is a stable construction. The shoulder 15 has an oblique edge 20, and as a result the occurrence of strong mechanical strains and the risk of crack development in the package in the face of external mechanical but also thermal stresses and that would exist if the end of the shoulder tapered to a point is avoided.

Figure 2:
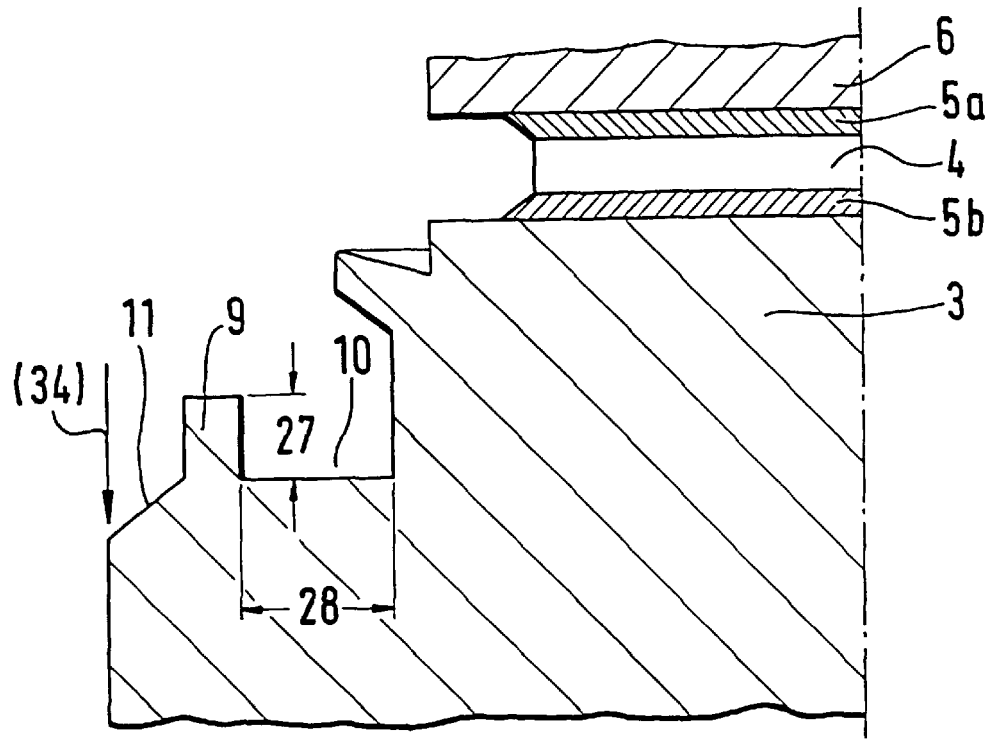
FIG. 2 shows a detail of FIG. 1 in a schematic enlargement.
Figure 3:
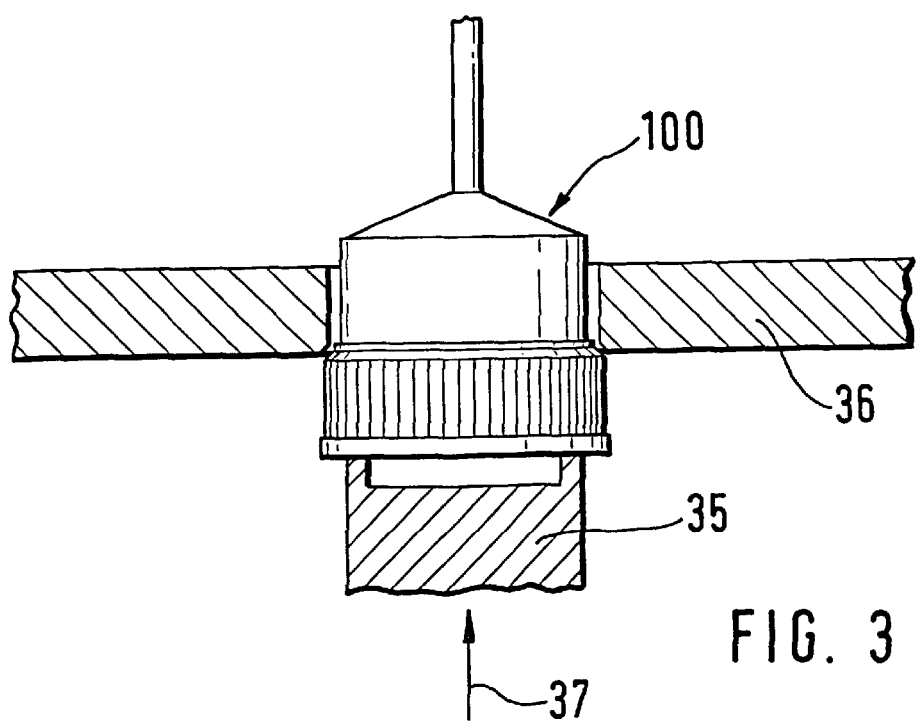
FIG. 3 is a schematic view of the process on press-fitting of the rectifier diode.

FIGS. 2 and 3 illustrate the press-fitting operation and the force acting on the rectifier diode therein. When the rectifier diode is press-fitted into a rectifier arrangement 36, a press-fitting die 35 is used (see FIG. 3), which transmits a press-fitting force 37 ont ot he base 2 of the rectifier diode 100. The press-fitting die 35 is preferably embodied such that it presses against only a peripheral region of the base bottom. The rectifier arrangement 36 exerts a counter force 34 on the press-fit region 11 of the base of the rectifier diode 100 (see FIG. 2). The semiconductor chip 4 and the solder layers 5a, 5b surrounding it are on the one hand markedly higher than the engagement point of the force that acts on the bad during press-fitting, and on the other they are coupled from the region of major deformation by the encompassing trench 10. As a consequence, the likelihood that the chip will damaged by the press-fitting is markedly reduced. FEM calculations and also experiments have confirmed this. Furthermore, the trench is embodied with a width to depth ratio of 2 to 1 such simple construction of the pedestal with the bulwark and trench thus makes it possible to employ high press-fitting forces with minimal deformation of the semiconductor chip.

The securing of the head wire 8 (FIG. 4) is designed such that three essential demands made of it are met.

FIGS. 2 and 3 illustrate the press-fitting operation and the force acting on the rectifier diode therein. When the rectifier diode is press-fitted into a rectifier arrangement 36, a press-fitting die 35 is used (see FIG. 3), which transmits a press-fitting force 37 onto the base 2 of the rectifier diode 100. The press-fitting die 35 is preferably embodied such that it presses against only a peripheral region of the base bottom. The rectifier arrangement 36 exerts a counter force 34 on the press-fit region 11 of the base of the rectifier diode 100 (see FIG. 2). The semiconductor chip 4 and the solder layers 5a, 5b surrounding it are on the one hand markedly higher than the engagement point of the force that acts on the bade during press-fitting, and on the other they are coupled from the region of major deformation by the encompassing trench 10. As a consequence, the likelihood that the chip will damaged by the press-fitting is markedly reduced. FEM calculations and also experiments have confirmed this. Furthermore, the trench is embodied with a width to depth ratio of 2 to 1 such that the base can be produced economically. The sturdy, simple construction of the pedestal with the bulwark and trench thus makes it possible to employ the high press-fitting forces with minimal deformation of the semiconductor chip.

The securing of the head wire 8 (FIG. 4) is designed such that three essential demands made of it are met:

6. For pulse strength, as is needed for diodes, especially Zener diodes that are usual for generators, the head 6, 7 must have the highest possible thermal capacity. For a given material, a sufficiently large mass is thus required. A limiting factor is the demand for the least possible structure height 29 of the rectifier diode, which is needed for a compact design.

7. The head must be as stiff as possible. Once the diode 100 has been installed in the rectifier arrangement 36, the head wire 8 is subject to tensile stress from vibration during operation. If the head is merely designed cylindrically, the result can be several sagging when tensile stresses occur at right angles to the plane of the semiconductor chip. This leads to a highly nonhomogeneous distribution of force over the contacting solder layer 5a; that is, locally very high stresses can occur in the solder layer. The consequences of this are accelerated aging, an increase in the thermal resistance, and finally premature failure of the diode.

8. For high pressure to cyclic temperature stress on the part of the diode 100, it is necessary between the head 6, 7 and the base 2 to establish a form lock via the package 13. To that end, the head must be sufficiently well covered with casting composition. However, it is practically solely the normal component 32 of the axial tensile force 30 (FIG. 4) that contributes to the cramping. The tangential component 31 of the tensile force 30 can be practically ignored as an adhesive force of the casing composition in a metal surface. In this sense it would be ideal to embody the head cylindrically. But this is counter to the demand for both compact structural height and high rigidity at the same time.

9. The advantage of the invention in this respect is that the head can be embodied of one cylindrical part and one conical part. The head cone 7 allows sufficient coverage with casting composition on the outer diameter with a simultaneously compact design (low structural height). If the angle 33 of the head cone 7 is typically 20°, then despite the conical shape an optimal utilization of force of approximately 94% of the axial tensile force is obtained for the sake of the form lock of the package and the head. Because of the conical embodiment of a portion of the head, the rigidity is moreover increased considerably, and tensile forces that occur are thus distributed uniformly over the entire surface. The head cylinder 6, conversely, assures the largest possible mass, so that for a given specific thermal capacity the highest possible pulse strength of the Zener diode can be assured.

10. The special design of the package 13 in the region of the head 6, 7 represents further optimization in terms of a more-compact design. The package 13 is form-lockingly joined to the base 2 by the shoulder 15. The package can also exert forces on the head. These forces are higher in the peripheral region of the head than in the center of the head where the head wire is secured. The package is therefore designed as substantially thicker in the peripheral region of the head than in the middle region (FIG. 1).

Thus beginning at the protective sheath 12, for instance, there is a slightly rising course of the package 13 toward the head wire 8.

Figure 5:
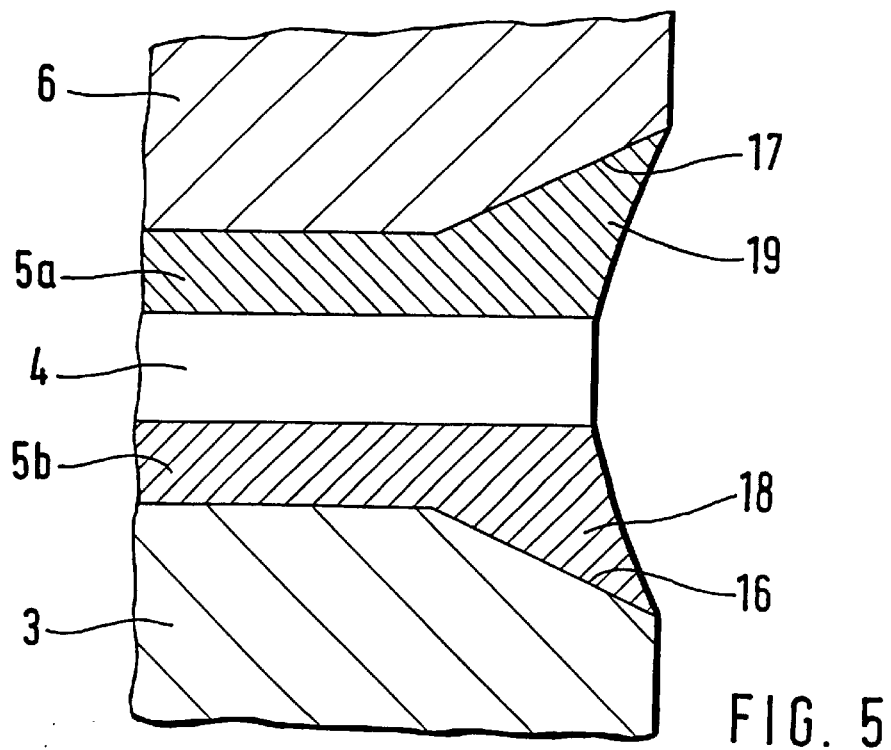
FIG. 5 shows a third detail of FIG. 1 in a schematic enlargement.

FIG. 5 shows a detail of FIG. 1 at the edge of the semiconductor chip 4. The head cylinder 6 and the pedestal 3 each have a respective chamfer 16 and 17 on the edge. The free region between the pedestal and semiconductor chip, and between the semiconductor chip and the head cylinder, is filled with solder 18 and 19, respectively, for instance. An advantage of this is that in the region of the maximum diameter, in the case of round chips or geometrically adapted bases and heads, a thicker solder layer can be established over the entire circumference, thus drastically reducing solder fatigue. Solder fatigue and especially solder creepage, which are caused by the different thermal expansion behavior of silicon and the head or pedestal, depend strongly on geometrical conditions. Shearing of the solder layer is greater the less the layer thickness of the solder and the longer the sheared region is. Via the chip diagonal or at the corners, the solder would age to an increasing extent, and solder creepage could lead to premature failure of the diode from short circuiting. Because of the additionally solder-filled region 18 and/or 19, an extremely high resistance to cyclic temperature stress on the part of the diode is thus achieved. Thus the advantage of a thin solder layer in the middle of the chip (low heat resistance) is combined with high resistance to cyclic temperature stress. Alternatively to a chamfer, a shoulder may also be provided, and the base or the head may be rounded in the region of the corners of the chip. An alternative, this rounding, chamfer, shoulder and so forth can also be provided on the chip. The passivation 14 covers the solder 18 and/or 19.

What is claimed is:

1. A rectifier diode, comprising a base which is press-fittable into an intended opening of a rectifier arrangement; a pedestal disposed on said base integrally with said base; a semiconductor chip secured to said pedestal; a head wire secured to said chip, said base being formed to connect the diode thermally and electrically to the rectifier arrangement; and means for mechanically stabilizing said base and including a bulwark provided on a bottom of said base in a region of said pedestal and surrounding said pedestal, said bulwark being separated from said pedestal by a trench and being integral with the bottom of said base; a pressing region for absorbing forces oriented at right angles to a plane of said semiconductor chip and disposed on a side of said bulwark remote from said trench and between bulwark and a substantially cylindrical wall of said base disposed substantially perpendicular to the bottom of said base, said trench being located between said bulwark and said pedestal and having a radial extent that is approximately twice as great as a height of said bulwark measured from said trench upward.

2. A rectifier diode as defined in claim 1; and further comprising a head cone and a head cylinder joining said head wire to said semiconductor chip.

3. A rectifier diode as defined in claim 1; and further comprising a package that protects said semiconductor chip.

4. A rectifier diode as defined in claim 1, wherein said pedestal has a chamfer on an outer edge in a region of said semiconductor chip, and a solder applied in a region of said chamfer.

5. A rectifier diode as defined in claim 1, wherein said pedestal has a chamfer on an outer edge in a region of said semiconductor chip, and a passivation applied in a region of said chamfer.

6. A rectifier diode as defined in claim 1; and further comprising a package that protects said semiconductor chip, said pedestal having a shoulder which protrudes into said package.

7. A rectifier diode as defined in claim 2, wherein said head cone has a jacket line at an angle of approximately 20° to a plane of said semiconductor chip; and further comprising a package that protects said semiconductor chip.

8. A rectifier diode as defined in claim 2, wherein said head cylinder has a chamfer on an outer edge in a region of said semiconductor chip, and a solder applied in a region of said chamfer.

9. A rectifier diode as defined in claim 2, wherein said head cylinder has a chamfer on an outer edge in a region of said semiconductor chip, and a passivation applied in a region of said chamfer.

10. A rectifier diode as defined in claim 7, wherein said package that protects said semiconductor chip is thicker in a region of an outer edge of said head cone than in a region in the vicinity of said head wire.

11. A rectifier diode as defined in claim 6, wherein said shoulder has an oblique edge.

* * * * *